United States Patent [19]

Tanishita

[11] Patent Number: 5,041,986

[45] Date of Patent: Aug. 20, 1991

[54] LOGIC SYNTHESIS SYSTEM COMPRISING A MEMORY FOR A REDUCED NUMBER OF TRANSLATION RULES

[75] Inventor: Hisato Tanishita, Tokyo, Japan

[73] Assignee: NEC Corporation, Tokyo, Japan

[21] Appl. No.: 415,961

[22] Filed: Oct. 2, 1989

[30] Foreign Application Priority Data

Sep. 30, 1988 [JP] Japan .............................. 63-246893

[51] Int. Cl.$^5$ ......................... G06F 15/60; G06F 7/00
[52] U.S. Cl. .................................... 364/489; 364/488
[58] Field of Search ............... 364/488, 489, 490, 578; 371/23

[56] References Cited

U.S. PATENT DOCUMENTS

| | | | |
|---|---|---|---|
| 4,703,435 | 10/1987 | Darringer et al. | 364/488 |
| 4,803,636 | 2/1989 | Nishiyama et al. | 364/488 |
| 4,835,705 | 5/1989 | Fujino et al. | 364/488 |
| 4,882,690 | 11/1989 | Shinsha et al. | 364/488 |
| 4,896,272 | 1/1990 | Kurosawa | 364/488 |
| 4,916,627 | 4/1990 | Hathaway | 364/488 |
| 4,942,536 | 7/1990 | Watanabe et al. | 364/488 |

OTHER PUBLICATIONS

Geus; "Logic Synthesis Speeds ASIC Design"; IEEE Spectrum, 1989.
Gabay; "Diverse Design Tools Break into Logic-Synthesis Arena"; Computer Design, 1987.
Shinsha et al.; "Incremental Logic Synthesis through Gate Logic Structure Identification"; IEEE.

Primary Examiner—Parshotam S. Lall
Assistant Examiner—Ellis B. Ramirez
Attorney, Agent, or Firm—Foley & Lardner

[57] ABSTRACT

In a system which synthesizes a design of a logic circuit from a system input signal representative of an input logical expression of the logic circuit, a memory memorizes fundamental codes and fundamental patterns which are in one-to-one correspondence to the fundamental codes. Responsive to the system input signal, a first code producing arrangement produces a first code corresponding to the input logical expression. Connected to the memory and the first code producing arrangement, a judging circuit judges whether or not the first code is identical with none of the fundamental codes. When the judging circuit judges that the first code is identical with none of the fundamental codes, a second code producing arrangement produces a second code which is a succession of selected ones of the fundamental codes that are selected in accordance with the first code. Connected to the memory, a translating arrangement translates the second code into a translated signal representative of the design with reference to the selected ones of the fundamental codes and selected ones of the fundamental patterns that are in correspondence to the selected ones of the fundamental codes. The translated signal represents a succession of the selected ones of the fundamental patterns. The selected ones of the fundamental codes may be selected from the fundamental codes repetitively. When the first code is identical with one of the fundamental codes, the system is operable like a conventional system.

2 Claims, 3 Drawing Sheets $$X = A * B * C * D$$
FIG. 2
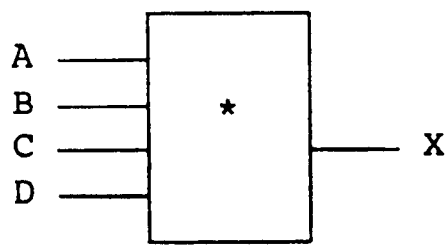
FIG. 3
FUNDAMENTAL CODE → FUNDAMENTAL PATTERN
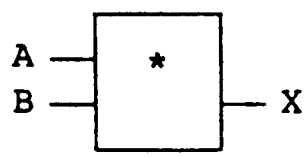 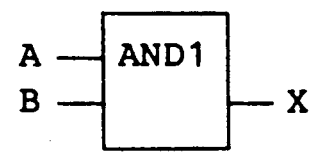
FIG. 4

LOGIC SYNTHESIS SYSTEM COMPRISING A MEMORY FOR A REDUCED NUMBER OF TRANSLATION RULES

BACKGROUND OF THE INVENTION

This invention relates to a logic synthesis system for synthesizing a design of a logic circuit from a system input signal with reference to a translation table.

For the logic synthesis system of the type described, the system input signal represents an input logical expression of the logic circuit. The logic synthesis system thereby produces a system output signal representative of the design.

A conventional logic synthesis system comprises a memory for memorizing a plurality of fundamental code signals as memorized code signals and a plurality of fundamental pattern signals as memorized pattern signals in the form of a translation table. The fundamental code signals represent fundamental codes, respectively. The fundamental pattern signals represent fundamental patterns, respectively. The fundamental patterns are in one-to-one correspondence to the fundamental codes. The memory therefore memorizes translation rules indicative of the fundamental codes and the corresponding fundamental patterns in pairs.

Responsive to the system input signal, an intermediate code producing circuit produces an intermediate code signal representative of an intermediate code. The intermediate code corresponds to the input logical expression.

Connected to the memory and the intermediate code producing circuit, a translating circuit translates, with reference to the translation table, the intermediate code signal into a translated signal. The translating circuit will now be described a little more in detail. Responsive to the intermediate code signal, the translating circuit locates, as a located code signal, one of the memorized code signals that matches with the intermediate code signal. Subsequently, the translating circuit produces, as the translated signal, one of the memorized pattern signals that corresponds to the located code signal. The translated signal is used as the system output signal.

Such a logic synthesis system is disclosed, for example, by Takeshi YOSHIMURA in a Japanese technical paper published Oct. 21, 1987, by "Densi Joohoo Tusin Gakkai" (the Institute of Electronics, Information and Communication Engineers of Japan), VLD87-92, pages 9-16, under the title of "Ruuru Beesu to Arugorizumu ni motozuku Ronri Goosei Sisutemu (A Logic System Based on Rule-based and Algorithmic Approach)".

The conventional logic synthesis system is disadvantageous in that an increased number of the translation rules must be memorized in the memory in order to synthesize various designs of the logic circuits. Therefore, it is not easy to form the translation table in the memory. In addition, it is necessary to supply the system input signal to the logic synthesis system by the use of the memorized fundamental codes which are memorized in the memory. Thus, the system input signal is restricted by the fundamental codes.

SUMMARY OF THE INVENTION

It is therefore an object of this invention to provide a logic synthesis system which is capable of synthesizing various designs of logic circuits by using a memory which memorizes only a reduced number of translation rules.

It is another object of this invention to provide a logic synthesis system of the type described, which is capable of readily forming in the memory a translation table for memorizing the translation rules.

It is still another object of this invention to provide a logic synthesis system of the type described, wherein a system input signal is not restricted to the translation rules memorized in the memory.

Other objects of this invention will become clear as the description proceeds.

On describing the gist of this invention, it is possible to understand that a logic synthesis system is for synthesizing a design of a logic circuit in response to a system input signal representative of an input logical expression of the logic circuit to produce a system output signal representative of the design.

According to this invention, the system comprises: memorizing means for memorizing a plurality of fundamental code signals representing fundamental codes, respectively, and a plurality of fundamental pattern signals representing fundamental patterns, respectively, the fundamental patterns being in one-to-one correspondence to the fundamental codes; first code producing means responsive to the system input signal for producing a first code signal representative of a first code corresponding to the input logical expression; judging means connected to the memorizing means and the first code producing means for judging whether or not the first code is identical with none of the fundamental codes; second code producing means connected to the judging means for producing, when the judging means judges that the first code is identical with none of the fundamental codes, a second code signal representative of a second code which is a succession of selected ones of the fundamental codes; and translating means connected to the memorizing means, the judging means, and the second code producing means for translating, with reference to the selected ones of the fundamental codes and selected one of the fundamental patterns that are in correspondence to the selected ones of the fundamental codes, the second code signal into a translated code signal when the judging means judges that the first code is identical with none of the fundamental codes. The translated signal represents a succession of the selected ones of the fundamental patterns. The translated signal is used as the system output signal.

It is to be noted in connection with the above-described gist of this invention that the fundamental patterns are determined in compliance with a plurality of logical expressions which are used in designing most of logic circuits. Consequently, the judging means usually judges that the first code is identical with a matching one of the fundamental codes that matches with the first code.

BRIEF DESCRIPTION OF THE DRAWINGS

FIG. 2 exemplifies an input logical expression represented by a system input signal supplied to the logic synthesis system illustrated in FIG. 1;

FIG. 3 exemplifies a first code produced by an intermediate code producing circuit of the logic synthesis system illustrated in FIG. 1;

FIG. 4 exemplifies one of translation rules memorized in a memory of the logic synthesis system illustrated in FIG. 1;

DESCRIPTION OF THE PREFERRED EMBODIMENT

Figure 1:
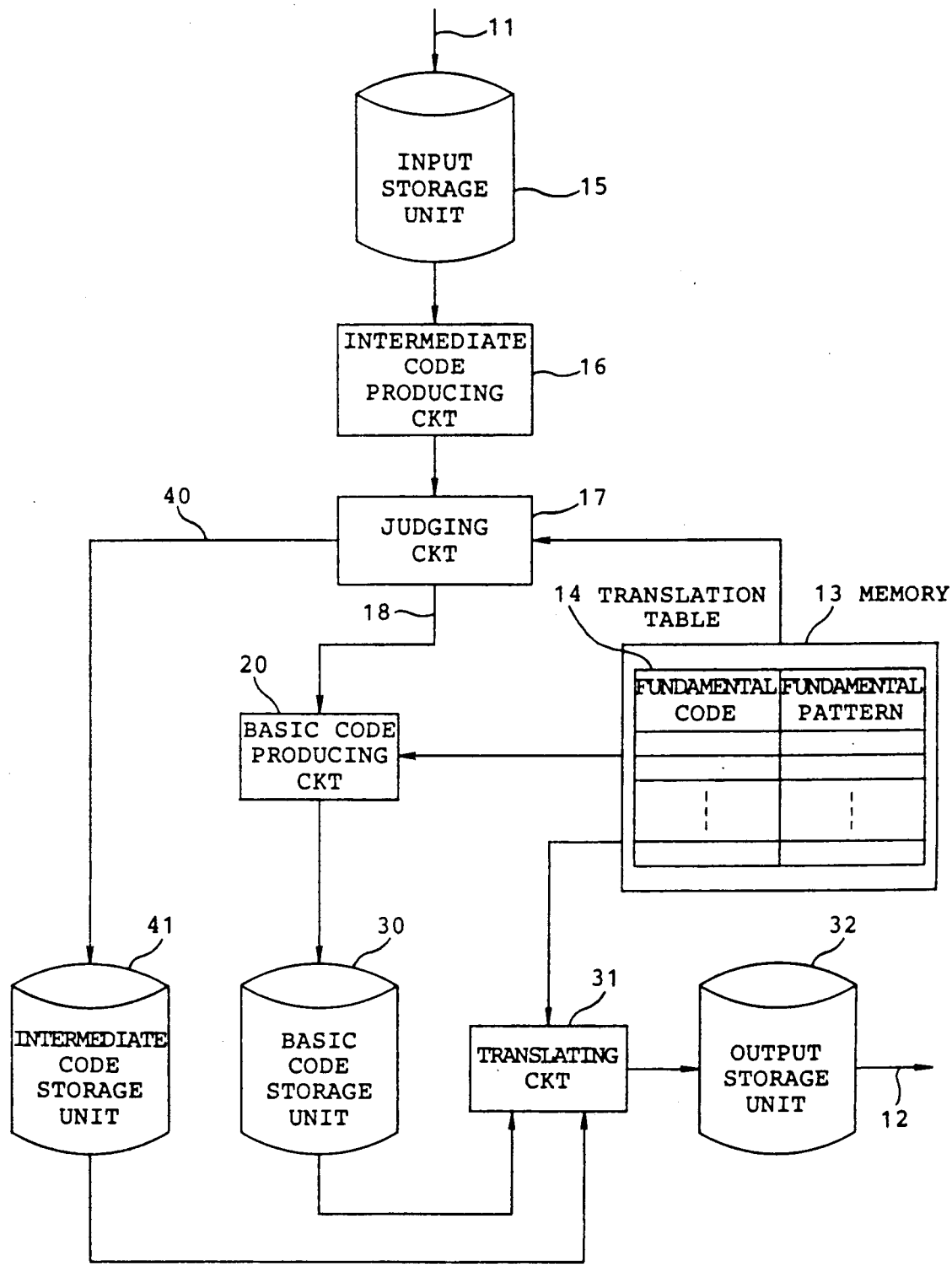
FIG. 1 is a block diagram of a logic synthesis system according to an embodiment of this invention.

Referring to FIG. 1, a logic synthesis system according to a preferred embodiment of this invention is for synthesizing a design of a logic circuit in response to a system input signal 11 representative of an input logical expression of the logic circuit. The logic synthesis system thereby produces a system output signal 12 representative of the design.

Turning temporarily to FIG. 2, an example of the input logical expression is illustrated. In the example being illustrated, the input logical expression is given in a Boolean equation as:

$$X = A \times B \times C \times D.$$

The Boolean equation expresses an AND gate as the logic circuit. The AND gate is supplied with four input signals A, B, C, and D.

Turning back to FIG. 1, the logic synthesis system comprises a memory 13 for memorizing a plurality of fundamental code signals as memorized code signals and a plurality of fundamental pattern signals as memorized pattern signals. The memorized code signals and consequently the fundamental code signals represent fundamental codes, respectively. The memorized pattern signals and therefore the fundamental pattern signals represent fundamental codes, respectively. The fundamental patterns are in one-to-one correspondence to the fundamental codes. The memory 13 therefore memorizes translation rules indicative of the fundamental codes and the corresponding fundamental patterns. In other words, the memory 13 memorizes the fundamental codes and the fundamental patterns in pairs in the form of a translation table 14.

The system input signal 11 is stored in an input storage unit 15 as a stored input signal. Responsive to the stored input signal, an intermediate code producing circuit 16 produces an intermediate or first code signal representative of an intermediate or first code. The first code corresponds to the input logical expression. The first code has node data and arc or edge data. The node data represent information of a logic operator and of input and output terminals of the logic operator. The logic operator is, for example, an AND operator, an OR operator, or an NOT operator. The arc data represent connection information between the individual node data.

Thus, a combination of the input storage unit 15 and the intermediate code producing circuit 16 is operable as a first code producing arrangement responsive to the system input signal 11 for producing the first code signal.

Turning to FIG. 3, an example of the first code is illustrated. The illustrated first code is produced by the first code producing arrangement, namely, the combination of the input storage unit 15 and the intermediate code producing circuit 16, both described in conjunction with FIG. 1 when the first code producing arrangement is supplied with the system input signal 11 (FIG. 1) representative of the input logical expression illustrated in FIG. 2. In the illustrated first code, the node data represent an AND operator *, input terminals A, B, C, and D of the AND operator *, and an output terminal X of the AND operator * while the arc data represent connection information indicating that the AND operator * is connected to each of the input and the output terminals A, B, C, D, and X.

Turning back to FIG. 1 again, attention will be directed to the translation rules of the translation table 14 of the memory 13. As mentioned above, the translation rules are indicative of the fundamental codes and the corresponding fundamental patterns in pairs.

Each of the fundamental codes has node data and arc data like the first or intermediate code produced by the intermediate code producing circuit 16. The node data represent information of a logic operator and of input and output terminals of the logic operator. The logic operator is, for example, an AND operator, an OR operator, or an NOT operator. The arc data represent connection information between the individual node data.

Each of the fundamental patterns also has node data and arc data. In each of the fundamental patterns, the node data represent information of a name of a logic gate corresponding to the logic operator of the fundamental code which corresponds to the fundamental pattern in question. The arc data of the fundamental pattern in question represent information of input and output terminals of the logic gate.

Turning to FIG. 4, an example of one of the translation rules memorized in the memory 13 (FIG. 1) is illustrated. That is, a pair of a fundamental code and a fundamental pattern is illustrated. In the illustrated fundamental code, the node data represent an AND operator *, two input terminals A and B of the AND operator *, and an output terminal X of the AND operator * while the arc data represent that the AND operator * is connected to each of the input and the output terminals A, B, and X.

In the illustrated fundamental pattern, the node data represent a name AND1 of an AND gate corresponding to the AND operator of the illustrated fundamental code. The arc data of the illustrated fundamental pattern represent information of input and output terminals A, B, and X.

Turning back to FIG. 1 once again, a judging circuit 17 is connected to the memory 13 and the intermediate code producing circuit 16 to judge whether or not the first code is identical with none of the fundamental codes memorized in the memory 13. The judging circuit 17 thereby supplies a first signal transmission line 18 with a noncoincidence result signal which indicates that the first code is identical with none of the fundamental codes. Furthermore, the judging circuit 17 supplies the first code signal to the first transmission line 18 as a transferred code signal. Thus, the judging circuit 17 supplies the noncoincidence result signal and the transferred code signal to the first signal transmission line 18 when the judging circuit 17 judges that the first code is identical with none of the fundamental codes.

It will be assumed that the first code illustrated in FIG. 3 is produced by the intermediate code producing circuit 16 and that the translation rule illustrated in FIG. 4 is memorized in the memory 13. In this case, the judging circuit 17 judges that the first code illustrated in FIG. 3 is not identical with the fundamental code of the translation rule illustrated in FIG. 4.

In FIG. 1, a basic or second code producing circuit 20 is connected to the judging circuit 17 through the first signal transmission line 18. Responsive to the non-coincidence result signal and the transferred code signal, the basic or first code producing circuit 20 produces a basic or second code signal representative of a basic or second code when the judging circuit 17 judges that the first code is identical with none of the fundamental codes. The basic or second code is a succession of selected ones of the fundamental codes. The selected ones of the fundamental codes are selected in accordance with the first code.

It is to be noted in connection with the fundamental patterns memorized in the memory 13 that the fundamental patterns are determined in compliance with a plurality of logical expressions used in designing a plurality of logic circuits. The input logical expression of the system input signal 11 is representative of a concatenation of chosen ones of the fundamental patterns that are chosen from the fundamental patterns with repetition allowed. The selected ones of the fundamental codes are in correspondence to the chosen ones of the fundamental patterns.

At any rate, the basic code producing circuit 20 is connected to the judging circuit 17 to convert the transferred code signal into the basic or second code signal when the judging circuit 17 judges that the first code is identical with none of the fundamental codes. It will be assumed that the first code illustrated in FIG. 3 is produced by the intermediate code producing circuit 16. In this case, the basic code producing circuit 20 produces the second code signal representative of the second code illustrated in FIG. 5. Operation of the basic code producing circuit 20 will presently be described more in detail with reference to FIG. 4 in addition to FIGS. 1 and 5.

The basic code producing circuit 20 converts the transferred code signal into the second code signal so that the second code represented by the second code signal does not have a redundant expression. In other words, the second code is formed so that the logic circuit is constructed by using minimum stages of the logic gates.

Figure 5:
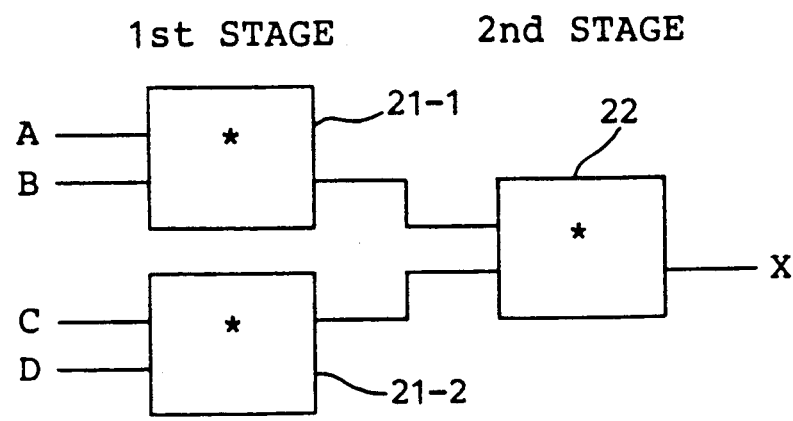
FIG. 5 exemplifies a second code produced by a basic code producing circuit of the logic synthesis system illustrated in FIG. 1.

In the example being illustrated in FIG. 5, the second code comprises first and second stages. The first stage comprises first and second fundamental codes 21-1 and 21-2 while the second stage comprises a single fundamental code 22. The first fundamental code 21-1 represents an AND operator having two input terminals A and B. The second fundamental code 21-2 represents another AND operator having two input terminals C and D. The single fundamental code 22 represents still another AND operator which has an output terminal X and two input terminals connected to output terminals of the fundamental codes 21-1 and 21-2.

In order to determine the first stage, the basic code producing circuit 20 calculates a quotient by dividing the number of the input terminals of the AND operator of the first code by the number of the input terminals of the AND operator of the fundamental code memorized in the memory 13. The AND operator of the fundamental code has a largest number of the input terminals among AND operators represented by the fundamental codes memorized in the memory 13. The number of the AND operators of the first stage is determined to be equal to the quotient. When a residue is produced on calculating the quotient, use is made of an AND operator having input terminals which are equal in number to the residue plus one. The AND operator having input terminals equal in number to the residue plus one is used in a last stage of the second code. One of the input terminals of the AND operator in question is connected to an output terminal of an AND operator of a front stage which is followed by the last stage. Likewise, the remaining stages are determined such that the logic circuit is constructed by using minimum stages of the logic gates.

Referring back to FIG. 1, a basic code storage unit 30 is connected to the basic code producing circuit 20. The basic or second code signal produced by the basic code producing circuit 20 is stored in a basic code storage unit 30 as a stored basic code signal.

A translating circuit 31 is connected to the basic code storage unit 30 and the memory 13. With reference to the selected ones of the fundamental codes and selected ones of the fundamental patterns that are in correspondence to the selected ones of the fundamental codes, the translating circuit 31 translates the stored basic code signal into a translated signal when the judging circuit 17 judges that the first code is identical with none of the fundamental codes. The translated signal represents a succession of the selected ones of the fundamental patterns. The translated signal is stored in an output storage unit 32 to be produced as the system output signal 12.

Thus, the translating circuit 31 serves in cooperation with basic code storage unit 30 and the output storage unit 32 as a translating arrangement. The translating arrangement is connected to the memory 13 and the second code producing circuit 20 for translating, with reference to the selected ones of the fundamental codes and selected ones of the fundamental patterns that are in correspondence to the selected ones of the fundamental codes, the second code signal into a translated signal when the judging circuit 17 judges that the first code is identical with none of the fundamental codes. The translated signal represents a succession of the selected ones of the fundamental patterns and is used as the system output signal 12.

Figure 6:
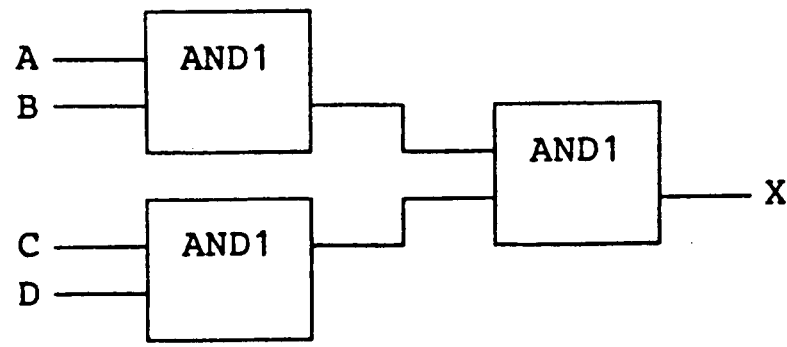
FIG. 6 exemplifies a design represented by a system output signal produced by the logic synthesis system illustrated in FIG. 1.

It will be assumed that the translating arrangement (namely, a combination of the translating circuit 31, the basic code storage unit 30, and the output storage unit 32) receives the second code signal representative of the second code illustrated in FIG. 5. In this case, the translating arrangement produces, as the system output signal 12, the translated signal illustrated in FIG. 6.

In FIG. 1, the judging circuit 17 transfers the intermediate or first code signal as the transferred code signal to a second signal transmission line 40 when the judging circuit 17 judges that the intermediate or first code is identical with one of the fundamental codes that matches with the intermediate or first code as a matching one of the fundamental codes. An intermediate code storage unit 41 is connected to the second signal transmission line 40. The transferred code signal is stored in the intermediate code storage unit 41 to be supplied to the translating circuit 31.

With reference to the matching one of the fundamental codes and a particular one of the fundamental patterns that corresponds to the matching one of the fundamental codes, the translating circuit 31 translates the transferred signal into an alternative translated signal when the judging circuit 17 judges that the first code is identical with the matching one of the function codes. The alternative translated signal represents the particular one of the fundamental patterns. The alternative translated signal is stored in the output storage unit 32 to be produced as the system output signal 12.

Thus, the translating circuit 31 serves also in cooperation with the intermediate code storage unit 41 as the translating arrangement. In this case, the translating arrangement is connected to the judging circuit 17 to translate, with reference to the matching one of the fundamental codes and a particular one of the fundamental patterns that corresponds to the matching one of the fundamental codes, the transferred code signal into an alternative translated signal when the judging circuit 17 judges that the first code is identical with the matching one of the fundamental codes. The alternative translated signal represents the particular one of the fundamental patterns and is used as the system output signal 12.

It will be assumed that the input logical expression represented by the system input signal 11 is given in a Boolean equation as:

$$X = A \times B.$$

The Boolean equation expresses, as the logic circuit, an AND gate which is supplied with two input signals A and B. It will also be assumed that the memory memorizes the translation rule illustrated in FIG. 4.

In this case, the intermediate code producing circuit 16 produces the intermediate or first code which is identical with the fundamental code illustrated in FIG. 4. Therefore, the judging circuit 17 transfers the first code through the second signal transmission line 40 to the translating arrangement comprising the intermediate code storage unit 41, the translating circuit 31, and the output storage unit 32. Responsive to the first code which is identical with the fundamental code illustrated in FIG. 4, the translating arrangement produces the alternative translated signal representing the fundamental pattern illustrated in FIG. 4 as the system output signal 12.

What is claimed is:

1. A logic synthesis system for synthesizing a design of a logic circuit in response to a system input signal representative of an input logical expression of said logic circuit to produce a system output signal representative of said design, said system comprising:

memorizing means for memorizing a plurality of fundamental code signals representing fundamental codes, respectively, and a plurality of fundamental pattern signals representing fundamental patterns, respectively, said fundamental patterns being in one-to-one correspondence with said fundamental codes;

first code producing means responsive to said system input signal for producing a first code signal representative of a first code corresponding to said input logical expression;

judging means connected to said memorizing means and to said first code producing means for judging whether or not said first code is identical with none of said fundamental codes;

second code producing means connected to said judging means for producing, when said judging means judges that said first code is identical with none of said fundamental codes, a second code signal representative of a second code which is a succession of selected ones of said fundamental codes that are selected in accordance with said first code; and translating means connected to said memorizing means, to said judging means, and to said second code producing means for translating, with reference to said selected ones of said fundamental codes and selected ones of said fundamental patterns that correspond to said selected ones of said fundamental codes, said second code signal into a translated signal when said judging means judges that said first code is identical with none of said fundamental codes, said translated signal representing a succession of said selected ones of said fundamental patterns, said translated signal being used as said system output signal;

said judging means transferring said first code signal as a transferred code signal when said judging means judges that said first code is identical with a matching one of said fundamental codes that matches said first code;

said translating means translating, with reference to said matching one of said fundamental codes and a particular one of said fundamental patterns that corresponds to said matching one of said fundamental codes, said transferred code signal into an alternative translated signal when said judging means judges that said first code is identical with said matching one of said fundamental codes, said alternative translated signal representing said particular one of said fundamental patterns, said alternative translated signal then being used as said system output signal.

2. A logic synthesis system as claimed in claim 1, wherein:

said fundamental patterns are determined in compliance with a plurality of logical expressions used in designing a plurality of logic circuits, said input logical expression being representative of a concatenation of chosen ones of said fundamental patterns that are chosen from said fundamental patterns repetitively, and wherein said selected ones of said fundamental codes are in correspondence with said chosen ones of said fundamental patterns.

* * * * *